United States Patent [19]

Medendorp et al.

[11] 4,122,400
[45] Oct. 24, 1978

[54] AMPLIFIER PROTECTION CIRCUIT

[75] Inventors: Dale Frederick Medendorp, Bethel Park; Paul Charles Schwabel, Pittsburgh, both of Pa.

[73] Assignee: RCA Corporation, New York, N.Y.

[21] Appl. No.: 790,200

[22] Filed: Apr. 25, 1977

[30] Foreign Application Priority Data

Nov. 8, 1976 [GB] United Kingdom ............... 46462/76

[51] Int. Cl.² .............................................. H03G 3/20
[52] U.S. Cl. ................................ 330/207 P; 325/150; 330/298
[58] Field of Search ........................... 330/298, 207 P; 325/150, 151, 159

[56] References Cited

U.S. PATENT DOCUMENTS

| 3,366,883 | 1/1968 | Griffin et al. ..................... 325/150 X |
| 3,866,136 | 2/1975 | Augustin et al. ..................... 330/298 |
| 4,019,150 | 4/1977 | Lurey et al. ................. 330/207 P X |

Primary Examiner—James B. Mullins
Attorney, Agent, or Firm—Eugene M. Whitacre; Paul J. Rasmussen; Robert L. Troike

[57] ABSTRACT

A protection circuit for a transmitter amplifier is provided in which separate VSWR (reflected power) control and separate temperature control is provided when the thresholds of either or both are exceeded. When the temperature of the RF amplifier is sensed and when this temperature exceeds a certain threshold level, the output level of the RF amplifier is adjusted to protect the amplifier. Separately, there is provided a means for sensing the ratio of the reflected power to the forward power and when this ratio exceeds a given threshold, the gain of the amplifier is cut back to thereby protect.

5 Claims, 2 Drawing Figures

AMPLIFIER PROTECTION CIRCUIT

BACKGROUND OF THE INVENTION

This invention relates to amplifier protection circuits and, more particularly, to amplifier protection circuits which sense temperatures and forward and reflected power. Amplifier protection circuits which sense forward and reflected power or temperature are well known in the state of the art, for example, see U.S. Pat. No. 3,449,680 of Schilb, et al and U.S. Pat. No. 3,641,451 of Hollingsworth, et al. These prior art circuits are rather complex with many components and yet have several disadvantages in that, for example, in some the gain of the amplifier is continuously cut back in a linear fashion such that the overall output gain of the amplifier is less than optimum even though a protection is not required. Although some form of threshold has been utilized in the others so that the output power can be at maximum until a certain dangerous threshold level is sensed, this threshold level for reflected power, for example, has also been related to temperature and the two parameters are interrelated and due to this interrelationship maximum power cannot be provided unless some means would be had to enable the temperature threshold and the reflective power threshold to be made independent. In the prior art circuits, the reflected power is sensed to determined the control. Since the reflected power may increase with an increase in forward power, no allowance is made in the protection circuit for increased forward power in the reflected power sensing mechanism causing the reflected power sensing mechanism in the prior art circuits to falsely cut back the gain of the transmitter amplifier when the forward power is increased.

SUMMARY OF THE INVENTION

Briefly, the above problems are solved with fewer components by having separate means for sensing the forward and reverse power level at output of a transmitter amplifier. The transmitter amplifier produces an output power level varying with a control signal applied thereto. A control circuit responsive to the forward and reverse power level at the output of the transmitter amplifier provides a control signal which varies in relation to only the forward power when the reflected power to forward power ratio is below a predetermined threshold and which control signal varies in relationship to the reflected power when the ratio is above said predetermined threshold.

DETAILED DESCRIPTION OF THE INVENTION

Figure 1:
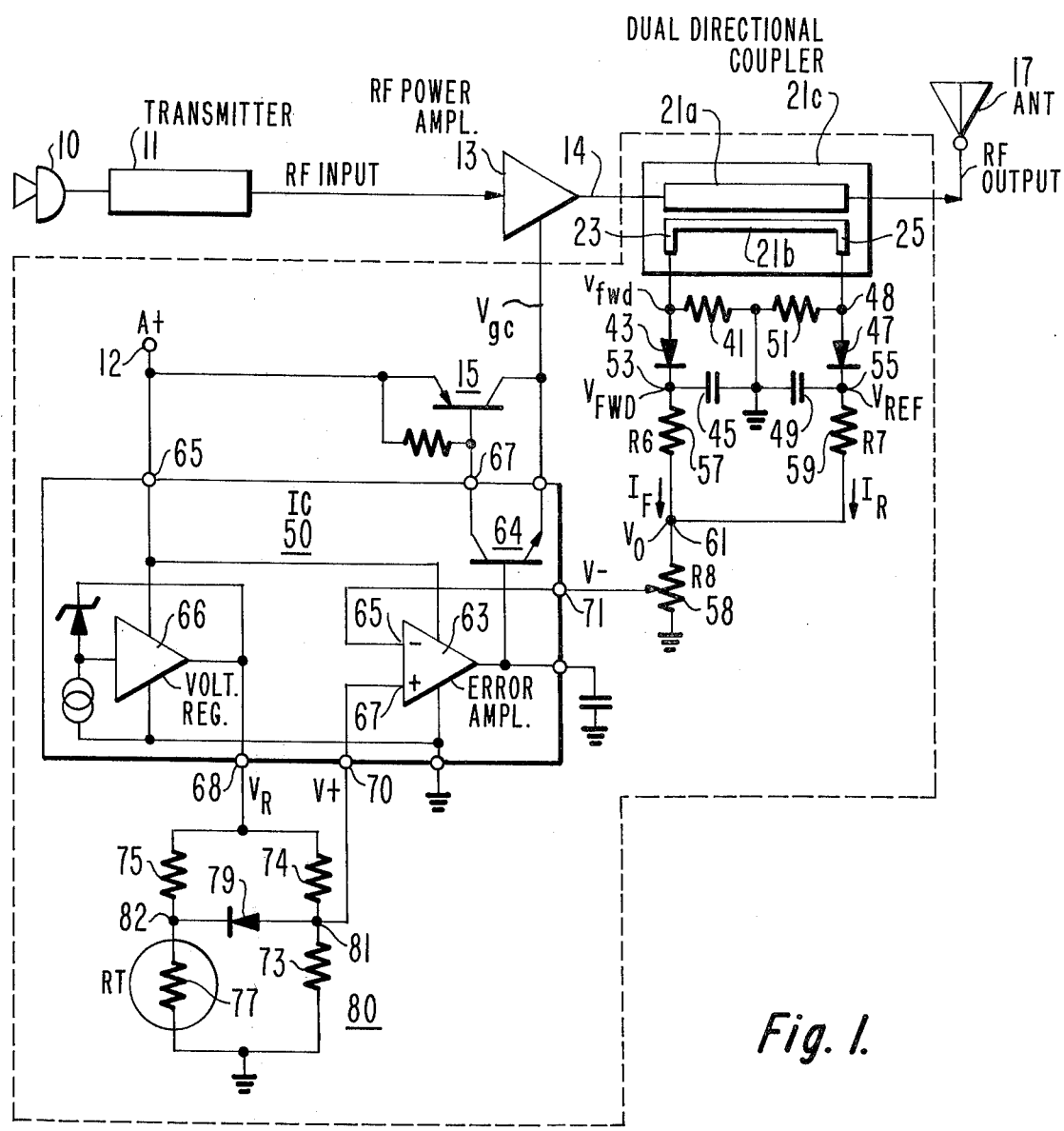
FIG. 1 is a combined schematic and block diagram of a radio transmitter and a transmitter amplifier protection circuit according to the present invention.

Referring to FIG. 1, audio signals received at the microphone 10 are coupled to transmitter 11. At the transmitter 11, the audio frequency modulates a radio frequency (RF) carrier. The frequency modulated RF signals at the transmitter are coupled to an RF power amplifier 13 where they are amplified to the desired RF power level and coupled via conductor 14 and the directional coupler portion of the protection circuit 19 to antenna 17 where the RF signals are radiated. The protection circuit 19 protects the RF power amplifier 13 by sensing both temperature and the ratio of "reflected" to "forward power."

The RF power developed by the transmitter amplifier 13 and coupled to antenna 17 is referred to as "forward power." Since the transmitter amplifier 13 and the antenna 17 are not at all frequencies ideally matched, part of the forward power coupled to the antenna 17 is reflected back to the amplifier 13. If, for example, the antenna 17 should be short circuited as when broken, all of the power from the power amplifier 13 would be reflected back to the power amplifier. The RF signal reflected back from the antenna 17 to the amplifier 13 is commonly referred to as "reflected power."

Forward power developed at amplifier 13 and reflected power coupled back to amplifier 13 on conductor 14 are coupled through dual directional coupler 21 in the protection circuit 19. The dual directional coupler 21, for example, may be a microstrip type coupler with the narrow conductors 21a and 21b parallel to each other and side coupled over a quarter wavelength at the carrier frequency. The conductors 21a and 21b are on one surface of dielectric substrate 21c with the opposite surface being covered by a sheet of conductive material (not shown). The main signal is coupled between the amplifier 13 and the antenna 17 via conductor 21a with a portion of that signal coupled to conductor 21b. In accordance with well known properties of such directional couplers, a portion of the signal travelling from the power amplifier 13 to the antenna 17 (forward power) appears at terminal 23 of conductor 21b with little or no signal at end 25 of conductor 21b. In a similar manner, a portion of the signal travelling in the opposite direction from antenna 17 toward amplifier 13 (reflected signals) is coupled to terminal 25 of conductor 21b with little or no signal at end 23 of conductor 21b. The coupler 21, therefore, senses forward and reflected power with a sample of forward power appearing at terminal 23 of conductor 21b and a sample of reflected power appearing at terminal 25 of conductor 21b. The end 23 of conductor 21b is terminated by resistance 41 and the end 25 is terminated in a resistance 51. The resistances 41 and 51 are each equal to the characteristic impedance ($Z_o$) of the coupled line. A forward power peak detector is provided including diode 43 and capacitor 45 with the anode of diode 43 coupled to terminal 23 of the coupler 21 and the cathode coupled at point 53 to one terminal of capacitor 45. The other terminal of capacitor 45 is coupled to ground or reference potential. The diode 43 is for example a Schottky barrier type diode. Similarly, reflected power is detected via the peak detector provided by the diode 47 and capacitor 49 with the anode of diode 47 coupled to terminal 25 of conductive strip 21b and the cathode connected at point 55 to one terminal end of capacitor 49. The opposite terminal end of capacitor 49 is coupled to ground or reference potential. The diode 47 is also a Schottky barrier type diode. A voltage is therefore derived at points 53 and 55 which is proportional to the positive RF peaks of the respectively forward and reflected power. Terminal 53 is coupled through voltage divider resistors 57 and 58 to ground or reference potential. A resistor 59 coupled to terminal 55 is coupled to the junction point 61 of resistors 57 and 58. A tapped point on resistor 58 is coupled to the inverting input 65 of an error amplifier or voltage differencing operational (error) amplifier 63 in integrated circuit 50 via terminal 71. The output voltage from error amplifier 63 is equal to the voltage difference of its inputs. Unless the reflection coefficient of the load exceeds a certain threshold, diode 47 is reversed biased and the voltage at the inverting input 65 is determined by the forward power.

A voltage V+ is provided to the non-inverting input of the operational (error) amplifier 63 via terminal 70 of the integrated circuit 50. This V+ voltage is provided from a stable voltage reference source $V_R$ via a high temperature foldback circuit 80. The stable reference voltage $V_R$ is provided at terminal 68 integrated circuit 50. A voltage regulator 66 in the integrated circuit 60 is coupled between battery source at terminal 12 and terminal 68. The output of operational amplifier 63 is coupled to a current driving transistor 64. Protection is provided in the embodiment shown by controlling the collector voltage ($V_{gc}$) to the power amplifier 13. The output difference voltage from the operational amplifier 63 is applied to the base of a current driving transistor 64. The collector of the current driving transistor 64 is coupled to the base of an opposite conductivity type (PNP) transistor 15, the emitter of which is coupled to the battery at source terminal 12. The collector of transistor 15 is coupled to the collector of power amplifier 13. The transistor 15 acts as a high current amplifier. The gain control voltage ($V_{gc}$) to the collector of the power amplifier 13 is equal to the error voltage from amplifier 63 minus the $V_{BE}$ drop across transistor 64. The overall loop behaves such that if V-voltage at terminal 65 of the operational (error) amplifier 63 is less than the V+ voltage at terminal 67 the difference voltage from the operational amplifier 63 causes the supply voltage ($V_{gc}$) to increase to the power amplifier 13 until the power output level or gain therefrom causes a voltage V— at terminal 65 that equals the voltage V+ at terminal 67. Likewise, if the voltage V— at terminal 65 is greater than the V+ at terminal 67, the difference voltage at the operational amplifier 63 causes the supply voltage ($V_{gc}$) to the power amplifier 13 to decrease (decreasing the gain) until the detected power output voltage V— at terminal 65 equals the voltage V+ at terminal 67.

High temperature foldback is provided by circuit 80 connected between terminals 68 and 70 of integrated circuit 50. This external circuit 80 is a resistor divider network comprising series resistors 73 and 74 connected in parallel with series connected resistor 75 and negative temperature coefficient thermistor 77. A diode 79 is connected between the junction 81 of series resistors 73 and 74 and the junction 82 of series connected resistor 75 and thermistor 77. The anode of diode 79 is connected to junction 81 and the cathode is connected to junction 82. The thermistor 77 is physically located near the RF power amplifier 13 to sense the heat level thereof. Under safe operating heat conditions, the diode 79 is reverse bias so that the V+ voltage at terminal 70 connected to the junction point 81 is a constant and determined by the voltage dividing resistors 73 and 74. As the temperature increases, the value of the thermistor 77 decreases to a point which is reached (the unsafe heat condition) where diode 79 with the cathode connected to the junction 82 becomes forward biased causing the voltage at terminals 81 and 70 to drop, providing an increasing drop in voltage V+ to the non-inverting terminal 67 of operational (error) amplifier 63. The voltage at the output of operational (error) amplifier 63 is correspondingly decreased causing via transistor 64 a corresponding drop in power supply ($V_{gc}$) to the RF power amplifier 13. The power amplifier 13 output drops to a level where the sampled forward power detected by diode 43 and provided at terminal 65 equals that at terminal 67. Similarly, when the temperature decreases and the voltage at V+ increases, the operational (error) amplifier 63 senses this difference (error) and provides an increased $V_{gc}$ voltage to the power amplifier 13 to a point where the sensed forward power detected by diode 43 equals the V+ voltage at terminal 67. It is to be noted that the temperature control of the RF power amplifier takes place only when a certain threshold temperature is exceeded which threshold is determined by the value of the thermistor 77. In this manner, the RF amplifier can be operated with maximum power until this temperature threshold is reached.

As discussed previously, "forward power" is detected via diode 43 and capacitor 45. Normally, the voltage appearing at terminal 65 of amplifier 63 is determined by the peak detector made of diode 43 and capacitor 45 and the voltage divider made up of resistors 57 and 58. As discussed previously, under these normal conditions, this forward power ($P_{fwd}$) is much greater than the reflected power ($P_{ref}$) and:

$$v_{fwd} = \sqrt{k\, P_{fwd}\, Z_o} \text{ volts RMS}$$

where K = power coupling coefficient and $v_{fwd}$ is voltage at terminal 23
the reflected voltage $$v_{ref} = \sqrt{k\, P_{ref}\, Z_o} \text{ volts RMS},$$

and $v_{ref}$ is the voltage at terminal 25 the value of the voltage at junction point 53 ($V_{FWD}$) is $$V_{FWD} = 1.414\, v_{fwd} - 0.5 \text{ volts DC}$$

$$V_{FWD} = 1.414\, \sqrt{k\, P_{fwd}\, Z_o} - 0.5 \text{ volts DC} \quad [1]$$

$$V_o = (V_{FWD}\, R8/R6 + R8) \text{ volts, where } V_o \text{ is the voltage at point 61} \quad [2]$$

where $R_8$ is the value of resistor 58 and R6 is the value of resistor 57

Because $P_{FWD} \gg P_{REF}$, diode 47 is reverse biased making the voltage at terminal 55 = $V_o$.

Since the operational (error) amplifier 63 functions in such a way as to adjust the gain of the RF amplifier 13 to hold V— equal to V+, for any given setting of resistor 58, $V_o$ will also be held constant. Equation [1] and [2] show that $P_{FWD}$ will be held constant when the output is properly terminated. The prime reason for a high output standing wave ratio (VSWR) or a high reflected power protection is to guard against excessive abuse to the final transistors in the transmitter RF power amplifier 13. However, some voltage standing wave is to be expected in any application and it is advantageous to have no gain reduction with normal load variations. This is the reason for the reverse biasing of diode 47 mentioned earlier. For the circuit to cause any reduction in the gain of the transmitter power amplifier 13 due to output voltage standing waves, the peak value of reflected voltage at point 48 ($v_{ref}$) must be greater than $V_o + 0.5$. volts. If $\rho'_L$ is the reflection coefficient of the load when the peak reflection voltage ($v_{ref}$) at terminated 25 = $V_o + 0.5$ then $$\rho'_L = \frac{v_{ref}}{v_{fwd}} \approx \frac{V_{REF}}{V_{FWD}} = \frac{V_o}{V_{FWD}} \qquad [3]$$

where $V_{REF}$ equals the detected voltage at junction point 55

From equation [2], $$V_{FWD} = \frac{R_6 + R_8}{R_8} V_o \qquad [10]$$

Therefore, $$\rho'_L = (R_8/R6+R8) \qquad [4]$$

Equation [4] shows that the magnitude of the reflection coefficient at which cutback starts to occur is determined by the values R6 and R8 of resistors 57 and 58 respectively only, and is independently of the absolute level of $P_{FWD}$ determined by the wiper arm setting of resistor 58 or the amount of thermal cutback. In other words, the reflection coefficient $\rho'_L$ is independent of the voltage $V_o$ at point 61. For any reflection coefficient of the load $\rho_L$ greater than the reflection coefficient $\rho'_L$ $$V_{REF} = \rho_L V_{FWD} \qquad [5]$$

$V_o = (I_F + I_R) R8$, where $I_F$ equals currents associated with forward power and $I_R$ equals current associated with reflected power $$V_o = \left( \frac{V_{FWD} - V_o}{R_6} + \rho_L \frac{V_{FWD} - V_o}{R7} \right) R8, \text{ where R7 is the value of resistor 59} \qquad [6]$$

$$V_{FWD} = V_o \left[ \frac{1/R8 + 1/R7 + 1/R6}{1/R6 + \rho_L/R7} \right] \qquad [7]$$

Figure 2:
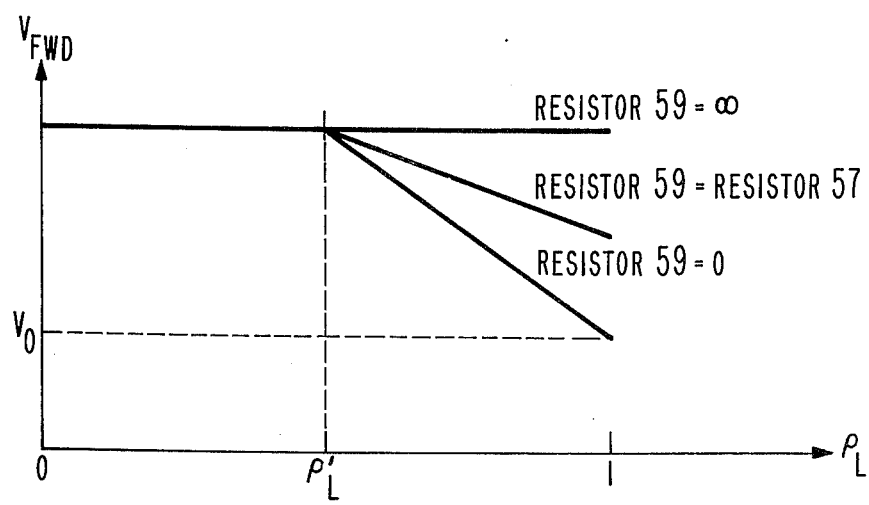
FIG. 2 is a graph of forward voltage vs. reflected power.

FIG. 2 is a graph of forward voltage at terminal 53 vs. reflection coefficient $\rho_L$ showing the effect of resistor 59 (value $R_7$) on the VSWR foldback. It is obvious that the value $R_7$ of resistor 59 determines amount of gain reduction that will be realized at $\rho_L = 1$ ($V_{SWR} = \infty$). Except where the value R7 of resistor 59 equals $\infty$, the forward voltage $V_{FWD}$ at terminal 53 begins to decrease at the reflection coefficient point $\rho'_L$ where diode 47 conducts. The slope of the decrease in voltage from that at $V_{FWD}$ to $V_o$ is determined by the value of resistor 59.

In a typical embodiment, the protection circuit for a 65 watt UHF mobile radio transmitter had the following parameters:

IC 50 is RCA CA723 sold by RCA Corp., Somerville, N.J.

diodes 43 and 47 are Schottky barrier diodes such as Hewlett-Packard (Palo Alto, Calif.) 5082 — 2800 diode 79 is type 1N914 resistors 41 and 51 are 68 Ω resistor 57 is 5.1kΩ (R6)

resistor 58 is 10 kΩ (R8)

resistor 59 is 100 Ω (R7)

resistor 73 is 910 Ω resistors 74 and 75 are 2 kΩ thermistor 77 is 10 kΩ at room temperature capacitors 45 and 49 are 330 picofarads PNP transistor 15 is a type 2N6111 transmission line formed with conductor 21a has a characteristic impedance of 50 Ω and the transmission line formed with conductor 21b has a characteristic impedance of 68 Ω.

What is claimed is:

1. The protection circuit for controlling the power of a transmitter amplifier which produces an output varying with a control signal applied thereto comprising:

first sensing means coupled to said transmitter amplifier for sensing the forward power provided therefrom, second sensing means coupled to said transmitter amplifier for sensing the reflected power thereto, and means coupled to said first and second sensing means for providing a control signal which varies in relation to only said forward power below a fixed predetermined threshold ratio of reflected power to forward power and which varies in relation to reflected power above said fixed predetermined threshold ratio regardless of temperature change unless the temperature at said amplifier exceeds a predetermined threshold considered alone to be an unsafe heat condition of said amplifier, whereby the power output from the transmitter amplifier is maximized until the ratio of reflected power to forward power exceeds said given threshold ratio.

2. The combination of claim 1 wherein said means for providing a control signal includes temperature sensing means responsive to only the temperature of said transmitter amplifier for providing a control signal to said transmitter amplifier to lower the output therefrom when only said sensed temperature exceeds said predetermined threshold considered to be an unsafe heat condition of said amplifier.

3. The combination claimed in claim 1, wherein said means for providing a control signal includes first and second peak detectors with said first peak detector coupled to said first sensing means and said second peak detector coupled to said second sensing means and said second peak detector including a diode being reverse biased by the peak detected level from said first peak detector until the value of the detected reflected power exceeds the reverse bias level established by the forward power.

4. The combination claimed in claim 3, including a comparator having one terminal thereof coupled to a source of reference voltage and a comparison terminal coupled to said peak detectors.

5. A protection circuit for a transmitter amplifier which produces an output which varies with a control signal applied thereto, comprising:

sensing means being responsive to the forward power at the output of said transmitter amplifier for providing a forward power signal which varies in relation to said forward power, reflected power sensing means coupled to the output of said transmitter amplifier to develop a reflected power signal which varies in proportion to the reflected power, means coupled to said forward and reflected power sensing means to develop a first signal which varies in relation to only said forward power below a fixed predetermined threshold ratio of reflected power to forward power and which varies in relation to reflected power above said fixed predetermined threshold ratio regardless of temperature change, means for providing a reference signal, signal comparing means responsive to said first signal and said reference signal for developing a control signal which varies in accordance with the difference between said reference signal and said first signal, means coupling said signal comparing means to the transmitter amplifier and applying said control signal thereto to control the power output from said transmitter amplifier, and temperature sensing means sensing the temperature of said transmitter amplifier and having a characteristic in accordance with said temperature, said reference signal being responsive to said temperature sensing means variations above a predetermined temperature level that is considered to be an unsafe heat condition of said amplifier to vary said reference signal whereby the difference between said first signal and reference signal changes.

* * * * *

UNITED STATES PATENT AND TRADEMARK OFFICE
CERTIFICATE OF CORRECTION

PATENT NO. : 4,122,400

DATED : October 24, 1978

INVENTOR(S) : DALE FREDERICK MEDENDORP et al

It is certified that error appears in the above-identified patent and that said Letters Patent is hereby corrected as shown below:

Column 1, line 29, that portion reading "determined" should read -- determine --; Column 3, line 13, that portion reading "circuit 60" should read -- circuit 50 --; Column 4, line 52, that portion reading "Equation" should read -- Equations --; lines 67 and 68, that portion reading "terminated" should read -- terminal --; Column 5, line 20, that portion reading "independently" should read -- independent --.

Signed and Sealed this

Twenty-third Day of January 1979

[SEAL]

Attest:

RUTH C. MASON
Attesting Officer

DONALD W. BANNER
Commissioner of Patents and Trademarks